United States Patent [19]

Cassese et al.

[11] Patent Number: 5,668,712

[45] Date of Patent: Sep. 16, 1997

[54] CIRCUIT FOR CONTROLLING A DC/AC CONVERTER IN A POWER SUPPLY CIRCUIT FOR A DISCHARGE LAMP OF A MOTOR VEHICLE HEADLIGHT

[75] Inventors: Bruno Cassese, Creteil; Patrick Wacheux, Villejuif; Gilles Paul, Fontenay-Aux-Roses; Eric Herzberger, Gagny; Jean-Marc Nicolai, Courbevoie, all of France

[73] Assignee: Valeo Electronique, Creteil, France

[21] Appl. No.: 626,183

[22] Filed: Mar. 29, 1996

[30] Foreign Application Priority Data

Mar. 29, 1995 [FR] France ................... 95 03730

[51] Int. Cl.$^6$ ................................. H03K 17/687
[52] U.S. Cl. ................................................ 363/95
[58] Field of Search .................... 363/22–26, 50, 363/55–56, 97, 131, 133–134; 307/10.1, 9.1

[56] References Cited

FOREIGN PATENT DOCUMENTS

| 0 154 062 | 9/1985 | European Pat. Off. . |
| 0 477 587 A1 | 4/1992 | European Pat. Off. . |
| 2 701 339 | 8/1994 | France . |
| WO90/13178 | 11/1990 | WIPO . |

*Primary Examiner*—Aditya Krishnan

*Attorney, Agent, or Firm*—McCormick, Paulding & Huber

[57] ABSTRACT

A circuit for controlling a DC/AC converter of a power supply circuit for a motor vehicle headlight discharge lamp, the circuit comprising a primary circuit, voltage-feed means for feeding the primary circuit with voltage, and a secondary circuit coupled to the primary circuit by mutual induction, the secondary circuit delivering a voltage controlling the non-conductive and conductive state of a MOSFET type transistor of the DC/AC converter, the voltage that the power supply means deliver to the primary circuit constituting a modulated high frequency carrier voltage, the secondary circuit including means for converting the high frequency voltage delivered to the primary circuit into a control voltage for the transistor that is greater than or less than a given non-conductive or conductive threshold, as a function of the modulation of said high frequency voltage, the conversion means of the secondary circuit including a switch connected between the grid and the source of the transistor, said switch being open circuit while a high frequency voltage is being delivered to the primary circuit and short circuiting the grid and the source of said transistor when the said high frequency voltage disappears, said conversion means also including first capacitor means providing the control voltage to the switch, and second capacitor means which charge whenever the high frequency is being delivered to the primary circuit and which discharge into said first capacitor means when said high frequency voltage disappears, whereby said first capacitor means then keep said switch in the conductive condition.

7 Claims, 2 Drawing Sheets

5,668,712

1

CIRCUIT FOR CONTROLLING A DC/AC CONVERTER IN A POWER SUPPLY CIRCUIT FOR A DISCHARGE LAMP OF A MOTOR VEHICLE HEADLIGHT

The present invention relates to a circuit for controlling a DC/AC converter in a power supply circuit for a discharge lamp of a motor vehicle headlight.

BACKGROUND OF THE INVENTION

Proposals have recently been made to feed motor vehicle discharge lamps with squarewave alternating currents at a frequency of about 200 Hz to 1 kHz.

FIG. 1 shows a circuit for providing that type of power supply.

The circuit comprises a DC/DC converter 1 powered with DC from the vehicle battery B and a DC/AC converter 2 connected between the converter 1 and the headlight discharge lamp 3. A high voltage pulse generator module 4 is connected in series therewith for triggering the lamp 3.

The DC/AC converter 2 comprises four fast switches $Q_1$ to $Q_4$ connected as an H-bridge and controlled by a control circuit 6. The switches $Q_1$ to $Q_4$ are MOS type transistors, for example, and the control circuit 6 controls the grid voltages thereof. They must be capable of withstanding isolated voltages in the range 0 V to 500 V in the discharge lamp, and also currents in the range 0 A to 3 A, including transients that may be as great at 10 A, lasting for a few hundredths of microseconds.

These constraints require the various components of the circuit 6 controlling the switches $Q_1$ to $Q_4$ to be large in size. This applies in particular to transformers included in such control circuits, which transformers are dimensioned so as to be capable of withstanding voltages of 500 V.

Unfortunately, it is presently desired that power supply control circuits for discharge lamps should be considerably reduced in bulk so that such circuits can be housed completely within headlights, whereas in the past the converters of power supply circuits have been external to headlights.

OBJECTS AND SUMMARY OF THE INVENTION

An object of the invention is therefore to provide a control circuit of a structure that enables its various components to be considerably smaller.

The structure of the invention also enables switching from one state to another to take place in a very short period of time (less than about 1 ns), even though the H-bridge switches at low frequency (200 Hz).

To this end, the invention provides a circuit for controlling a DC/AC converter of a power supply circuit for a motor vehicle headlight discharge lamp, the circuit comprising a primary circuit, voltage-feed means for feeding the primary circuit with voltage, and a secondary circuit coupled to the primary circuit by mutual induction, the secondary circuit delivering a voltage controlling the non-conductive and conductive state of a MOSFET type transistor of the DC/AC converter, the voltage that the power supply means deliver to the primary circuit constituting a modulated high frequency carrier voltage, the secondary circuit including means for converting the high frequency voltage delivered to the primary circuit into a control voltage for the transistor that is greater than or less than a given non-conductive or conductive threshold, as a function of the modulation of said high frequency voltage, the conversion means of the sec-

2 ondary circuit including a switch connected between the grid and the source of the transistor, said switch being open circuit while a high frequency voltage is being delivered to the primary circuit and short circuiting the grid and the source of said transistor when the said high frequency voltage disappears, said conversion means also including first capacitor means providing the control voltage to the switch, and second capacitor means which charge whenever the high frequency is being delivered to the primary circuit and which discharge into said first capacitor means when said high frequency voltage disappears, whereby said first capacitor means then keep said switch in the conductive condition.

The term "high frequency" voltage is used in the present text to mean frequencies of about or greater than 3000 kHz, with preferred frequencies being about 2 MHz.

As will have been understood, the fact of using high frequency voltages makes it possible to reduce to a very large extent the bulk of the transformers in control circuits of the invention.

Advantageously, the control circuit of the invention includes the following additional characteristics on their own or in any technically feasible combination:

said first and second capacitor means are selected in such a manner that the first means are not sufficiently recharged to cause said switch to return to the non-conductive condition in a half-period of the high frequency voltage;

the primary circuit is powered by a DC voltage source and includes a switch which is made non-conducting and conducting under the control of a modulated signal corresponding to the high frequency voltage; and the circuit is a circuit for controlling a DC/AC converter that includes four controlled switches connected in an H-bridge.

The invention also provides a power supply circuit for a motor vehicle headlight discharge lamp, said circuit including a DC/DC converter powered by the vehicle battery, for example, a DC/AC converter powered by the DC/DC converter, and a circuit for controlling the DC/AC converter, wherein the control circuit is constituted by a circuit of the above-specified type.

The invention also provides a motor vehicle headlight of the discharge lamp type, wherein its discharge lamp(s) is/are powered by a power supply circuit of the above-specified type.

BRIEF DESCRIPTION OF THE DRAWINGS

Other characteristics and advantages of the invention appear further from the following description. The description is purely by way of non-limiting illustration. It should be read with reference to the accompanying drawings, in which.

MORE DETAILED DESCRIPTION

Figure 1:
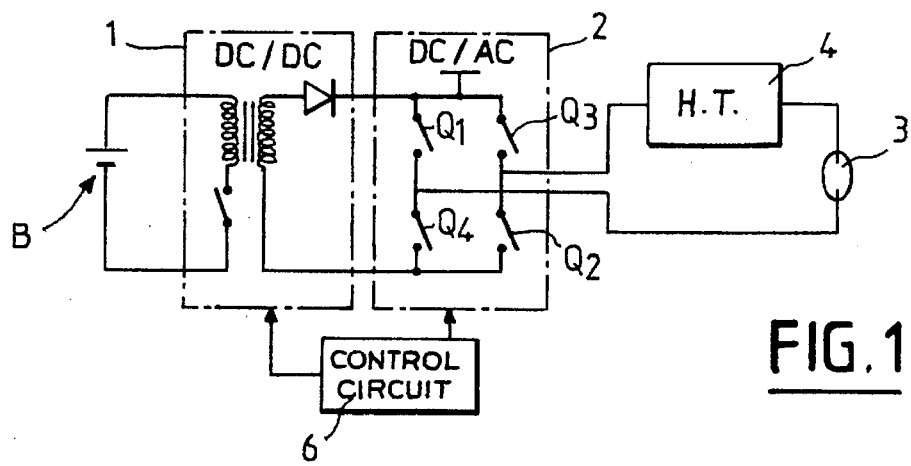
FIG. 1, as described above, is a diagram of a power supply circuit for a discharge lamp in a motor vehicle headlight.
Figure 2:
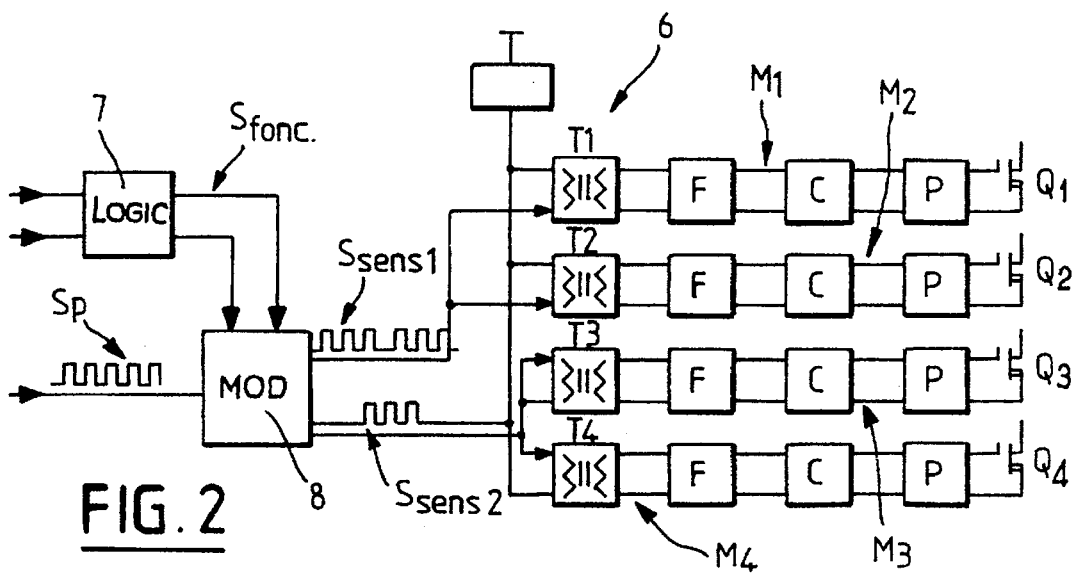
FIG. 2 is a block diagram showing how a circuit of the invention operates.
Figure 3A:
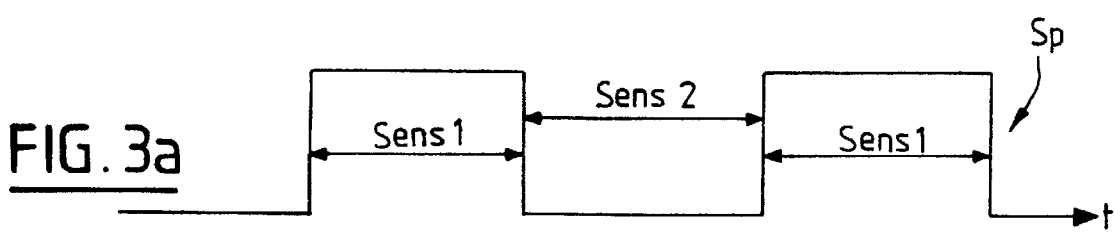
FIGS. 3a to 3c are diagrams of waveforms used in the circuit of FIG. 2.

The control circuit 6 shown in FIG. 2 comprises a logic unit 7 which generates squarewave binary signals $S_{fonc}$, of the type shown in FIG. 3a. Depending on the sense in which the H-bridge 3 is to operate, such a signal $S_{fonc}$ has one level or another level.

Figure 3B:
Figure 3C:
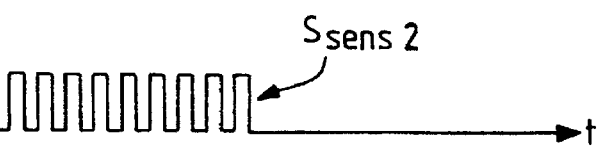

The sense-control signals $S_{fonc}$ are applied together with a high frequency carrier $S_P$ that is also generated by the logic unit 7 to an input of a modulator unit 8. As shown in FIGS. 3b and 3c, two signals $S_{sens1}$ and $S_{sens2}$ output by said unit 8 correspond respectively to the carrier $S_P$ modulated by the sense-control signal $S_{fonc}$ of FIG. 3a, and to the carrier $S_P$ modulated by the complement of the signal of FIG. 3a.

These signals $S_{sens1}$ and $S_{sens2}$ control respective pairs of switches, which are required to be opened or closed together. The signal $S_{sen1}$ controls the switches $Q_1$ and $Q_2$ while the signal $S_{sens2}$ controls the switches $Q_3$ and $Q_4$.

To this end, the signal $S_{sens1}$ is applied to the primary windings of two transformers $T_1$ and $T_2$, while the signal $S_{sens2}$ is applied to the primary windings of two other transformers $T_3$ and $T_4$ (FIG. 2).

The secondary windings of the transformers $T_1$ to $T_4$ feed the grid-source voltages of the transistors $Q_1$ to $Q_4$, each via a respective circuit $M_1$ to $M_4$ that performs the following functions:

the received high frequency control signal is filtered and the voltage $V_{gs}$ between the grid and the source of the transistor is held above a conductive state voltage +V so long as the high frequency sense-control signal is present (functions symbolized by the unit F in FIG. 2);

the grid-source voltage $V_{gs}$ of said transistor is switched off quickly whenever said signal disappears, with the transistor then being in the non-conductive state (function symbolized by unit C); and the corresponding transistor $Q_1$ to $Q_4$ is protected against saturation of the transformers $T_1$ to $T_4$ (function symbolized by the unit P).

Figure 4:
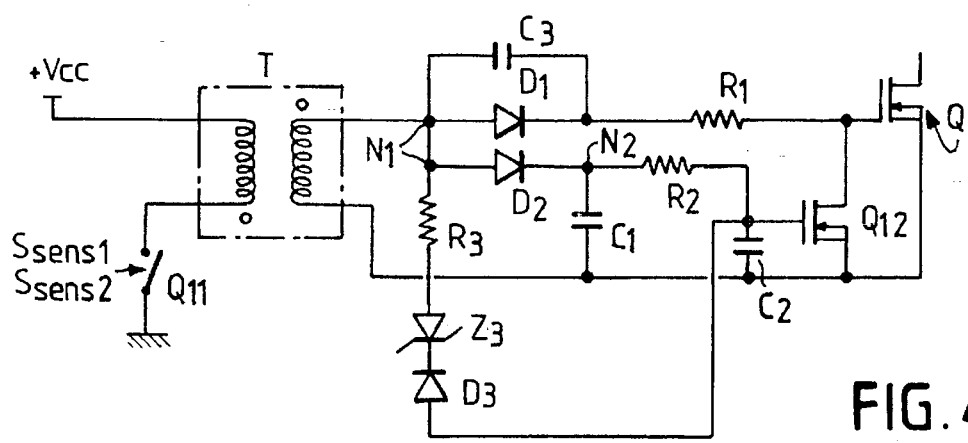
FIG. 4 is a circuit diagram corresponding to a portion of a circuit constituting one possible embodiment of the invention.

One possible circuit for controlling a switch Q by means of one of the signals $S_{sens1}$ and $S_{sens2}$ is shown in FIG. 4. The intermediate transformer is given reference T therein.

The primary winding of said transformer T is connected:

at one end to a source of positive voltage $+V_{cc}$ (+12 volts); and the other end thereof is connected to neutral or ground via a fast switch $Q_{11}$ controlled by one of the high frequency signals $S_{sens1}$ and $S_{sens2}$ output from the modulator unit 8.

By way of example, the switch $Q_{11}$ may be an MOS transistor having its grid receiving said high frequency signal $S_{sens1}$ or $S_{sens2}$.

The secondary winding of the transformer T is connected at one end to the anode of a diode $D_1$ whose cathode is connected to a resistor $R_1$. The opposite end of the resistor $R_1$ is connected to the grid of transistor Q. A capacitor $C_3$ is connected in parallel between the cathode and the anode of the diode $D_1$.

The other end of the secondary winding of the transformer T is connected to the source of a MOS type transistor $Q_{12}$. The grid of the transistor $Q_{12}$ is connected to a neutral point $N_1$ between the secondary winding and the diode $D_1$ by means of a circuit that includes a series connection of a resistor $R_3$, a zener diode $Z_3$ and a diode $D_3$. The diode $D_3$ conducts from the grid of the transistor $Q_{12}$ towards the secondary winding, while the zener diode $Z_3$ is connected the opposite way round.

The grid of the transistor $Q_{12}$ is also connected to a resistor $R_2$, whose end remote from the transistor $Q_{12}$ is connected to the cathode of a diode $D_2$ whose anode is connected to above-mentioned point $N_1$.

A capacitor $C_1$ is connected firstly to a point $N_2$ between the diode $D_2$ and the resistor $R_2$, and secondly to the source of the transistor $Q_{12}$.

A capacitor $C_2$ is connected between the grid and the source of the transistor $Q_{12}$.

As will have been understood, the transformer T is connected in a "flyback" circuit: i.e. it charges while switch $Q_{11}$ is open.

So long as the high frequency signal is present, operation is as follows.

While the switch $Q_{11}$ is closed, energy from the primary winding of the transformer T is transferred to the secondary winding so the grid of transistor Q charges via the diode $D_1$ and the resistor $R_1$.

The components $R_3$, $Z_3$, and $D_3$ then maintain a negative voltage across the terminals of capacitor $C_2$ and on the grid of transistor $Q_{12}$.

Capacitor $C_1$ charges to an initial value.

When $Q_{11}$ opens again, capacitor $C_1$ tends to recharge the capacitor $C_2$ via resistor $R_2$.

$C_1$, $R_2$, and $C_2$ are selected in such a manner that the voltage across the terminals of $C_2$ is prevented from rising to a positive value that is great enough for causing $C_{12}$ to conduct within one-half period of the high frequency signal.

The grid of transistor Q therefore remains charged so long as the high frequency carrier is present.

When the high frequency signal disappears, then capacitor $C_2$ charges to the same voltage as capacitor $C_1$.

Transistor $Q_{12}$ conducts, short circuiting the grid of transistor Q, and thereby holding it in the non-conductive state until the high frequency carrier reappears.

Figure 5:
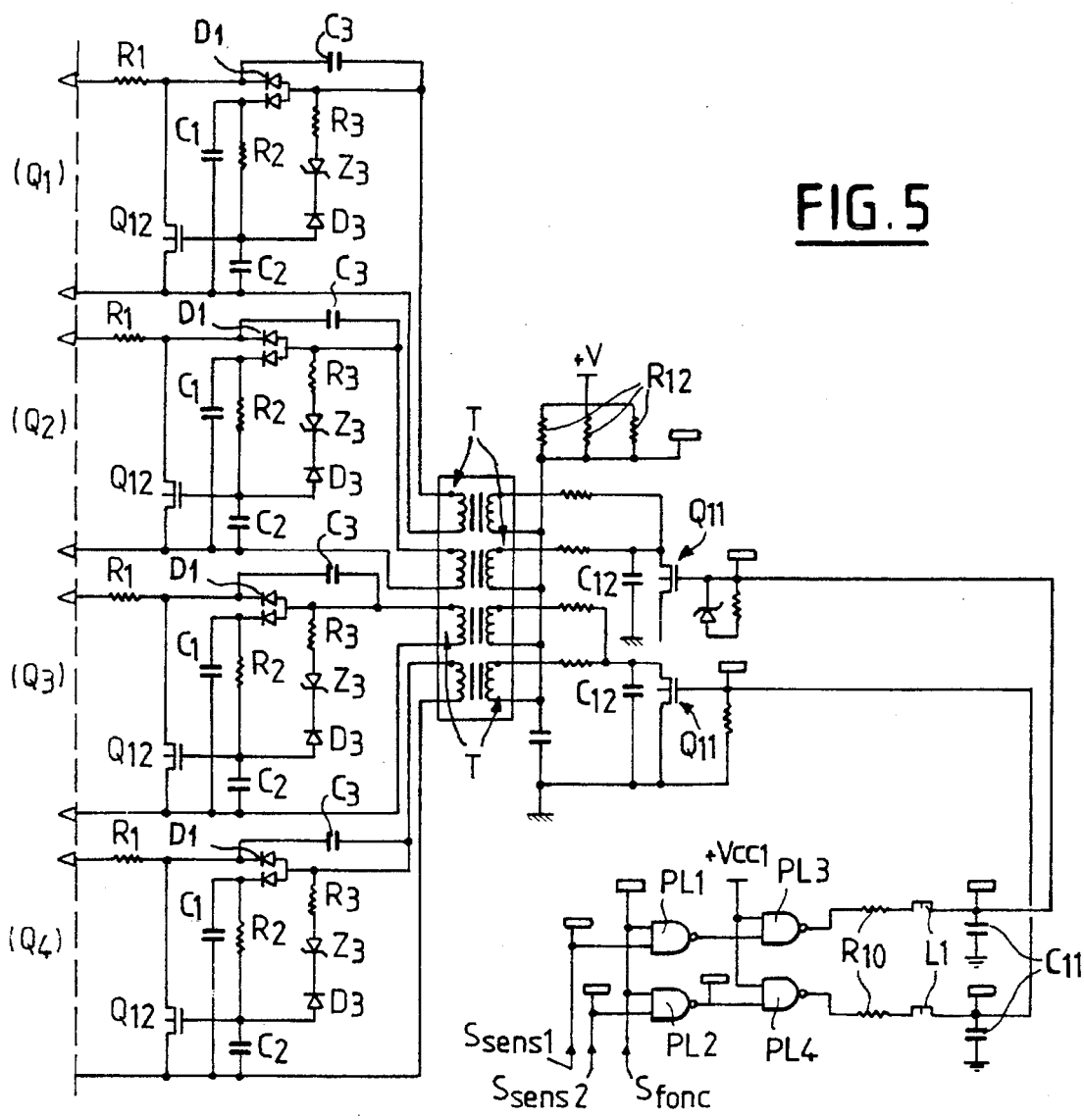
FIG. 5 is a full circuit diagram of a circuit of the invention.

FIG. 5 shows the detail of a control circuit that includes circuits of the type shown in FIG. 4.

The modulator unit 8 therein comprises four NAND type logic gates referenced $PL_1$ to $PL_4$.

On respective first inputs, logic gates $PL_1$ and $PL_2$ both receive the signal SP corresponding to the carrier at high frequency (e.g. at 2 MHg). The second input of gate $PL_1$ receives the sense-control signal $S_{fonc}$ of FIG. 3a, while the gate $PL_2$ receives the complement thereof.

The output signals from the gates $PL_1$ and $PL_2$ are applied as input signals respectively to the gates $PL_3$ and $PL_4$ which also receive a control voltage $V_{cc1}$.

The output signals from the gates $PL_3$ and $PL_4$ correspond to the signals $S_{sens1}$ and $S_{sens2}$ of FIGS. 3b and 3c.

The various logic gates $PL_1$ to $PL_4$ may be of the IC7 74 HC00D type.

The outputs from the gates $PL_3$ and $PL_4$ are applied to filter circuits each comprising a 47 ohm resistor $R_{10}$ in series with a 3.30 Henry inductor $L_1$ together with a parallel-connected capacitor $C_{11}$ having a capacitance of 100 picofarads between neutral and the output point of the circuit.

The outputs from these filter circuits are applied to the grids of two MMT 960 type MOS transistors that correspond to the transistor $Q_{11}$ in FIG. 4.

The sources of these two transistors $Q_{11}$ are connected to neutral. The drain of each of these two transistors $Q_{11}$ is connected to two primary windings of two transformers T via 120 ohm resistors $R_{11}$. 200 picofarad capacitors $C_{12}$ are connected in parallel between the drains of said transistors $Q_{11}$ and neutral.

At their opposite ends, the primary windings of the four transformers T are connected via a common node firstly to a voltage source +V via three parallel-connected resistors $R_{12}$ each having a resistance of 33 ohms, and secondly to a capacitor $C_{13}$ having a capacitance of 0.47 microfarads and having its opposite connected to neutral.

The four transformers T are of the 23Z100SM type and they are compact.

The secondary windings of these various transformers T power, respectively, the four grid-source voltages of the four transistor $Q_1$ to $Q_4$ (not shown in FIG. 5) via four secondary circuits of the type shown in FIG. 4.

The resistance of $R_3$ is 220 ohms.

The zener diode $Z_3$ is of the BZXB4C4D3 type.

The diode $D_3$ is of the BAS16 type.

The capacitor $C_2$ has a capacitance of 220 picofarads.

The resistor $R_2$ has a resistance of 22 kohms.

The capacitor $C_1$ has a capacitance of 0.1 microfarads.

The resistance of $R_1$ is 47 ohms.

The capacitance of capacitor $C_3$ is 100 picofarads.

The control circuit described above by way of example is sufficiently compact to be contained in a housing having a volume of 16 cm$^3$.

Naturally, other variants of the invention are possible. In particular voltage +V or $V_{cc}$ may be provided by the DC/DC converter in order to overcome variations in battery voltage.

We claim:

1. A circuit for controlling a DC/AC converter of a power supply circuit for a motor vehicle headlight discharge lamp, the circuit comprising a primary circuit, voltage-feed means for feeding the primary circuit with voltage, and a secondary circuit coupled to the primary circuit by mutual induction, the secondary circuit delivering a voltage controlling the non-conductive and conductive state of a MOSFET type transistor of the DC/AC converter, the voltage that the power supply means deliver to the primary circuit constituting a modulated high frequency carrier voltage, the secondary circuit including means for converting the high frequency voltage delivered to the primary circuit into a control voltage for the transistor that is greater than or less than a given non-conductive or conductive threshold, as a function of the modulation of said high frequency voltage, the conversion means of the, secondary circuit including a switch connected between the grid and the source of the transistor, said switch being controlled by the voltage of the first capacitor means, the conversion means comprising means which charge said first capacitor means, when the high frequency voltage is delivered to the primary circuit, so that the voltage of said capacitor means maintains the switch in open circuit, wherein said conversion means also charge a second capacitor means when the high frequency voltage is delivered to the primary circuit, said second capacitor means discharging in the first capacitor means when the high frequency voltage disappears, the voltage of the first capacitor means thus charged by the second capacitor means being of such a value that it keeps said switch in the conductive condition.

2. A circuit according to claim 1 wherein the switch is a MOS type transistor, the first capacitor means are connected between the grid and the source of said MOS type transistor, the second capacitor means being connected at one end to said source and at the other end to resistive means which remote end is connected to the grid of said MOS transistor, the common end of said second capacitor means and said resistive means being connected to the cathode of a diode which anode is connected to one end of the secondary winding, the common point of said secondary winding and said diode being also connected to a circuit which includes a series connection of a resistor, a Zener diode and a diode, the diode conducting from the grid of the switch MOS transistor towards the secondary winding, while the Zener diode is connected in the opposite way round, the common point of said secondary winding and of said series connection winding being also connected to the anode of an other diode whose cathode is connected to resistive mean, which opposite end is connected to the grid of the power transistor, a capacitor being connected in parallel between the cathode and the anode of said diode, the secondary winding being connected by its end remote from said common end to the source of the switch MOS transistor.

3. A circuit according to claim 1, wherein said first and second capacitor means are selected in such a manner that the first means are not sufficiently recharged to cause said switch to return to the non-conductive condition in a half-period of the high frequency voltage.

4. A circuit according to claim 1, wherein the primary circuit is powered by a DC voltage source and includes a switch which is made non-conducting and conducting under the control of a modulated signal corresponding to the high frequency voltage.

5. A circuit for controlling a DC/AC converter having four controlled switches connected in an H-bridge configuration, wherein it is constituted by a circuit according to claim 1.

6. A power supply circuit for a motor vehicle headlight discharge lamp, said circuit including a DC/DC converter powered by the vehicle battery, for example, a DC/AC converter powered by the DC/DC converter, and a circuit for controlling the DC/AC converter, wherein the control circuit is constituted by a circuit according to claim 1.

7. A motor vehicle headlight of the discharge lamp type, wherein the discharge lamp(s) is/are powered by a power supply circuit according to claim 6.

* * * * *